(12) United States Patent
Krishnan et al.

(10) Patent No.: US 8,650,451 B2
(45) Date of Patent: Feb. 11, 2014

(54) STOCHASTIC STREAM DECODING OF BINARY LDPC CODES

(75) Inventors: Anantha Raman Krishnan, Tucson, AZ (US); Nenad Miladinovic, Campbell, CA (US); Yang Han, Sunnyvale, CA (US); Shaohua Yang, Santa Clara, CA (US)

(73) Assignee: LSI Corporation, Milpitas, CA (US)

( * ) Notice: Subject to any disclaimer, the term of this patent is extended or adjusted under 35 U.S.C. 154(b) by 224 days.

(21) Appl. No.: 13/174,537

(22) Filed: Jun. 30, 2011

(65) Prior Publication Data

US 2013/0007551 A1    Jan. 3, 2013

(51) Int. Cl.
*H03M 13/00* (2006.01)

(52) U.S. Cl.
USPC ........... 714/752; 714/758; 714/801; 714/760; 714/755; 714/746; 714/751; 714/780; 714/800; 714/804

(58) Field of Classification Search
None
See application file for complete search history.

(56) References Cited

U.S. PATENT DOCUMENTS

| | | | |
|---|---|---|---|
| 5,278,703 A | 1/1994 | Rub et al. | |
| 5,278,846 A | 1/1994 | Okayama | |
| 5,317,472 A | 5/1994 | Schweitzer, III | |
| 5,325,402 A | 6/1994 | Ushirokawa | |
| 5,392,299 A | 2/1995 | Rhines | |
| 5,417,500 A | 5/1995 | Martinie | |
| 5,513,192 A | 4/1996 | Janku | |
| 5,523,903 A | 6/1996 | Hetzler | |
| 5,550,810 A | 8/1996 | Monogioudis et al. | |
| 5,550,870 A | 8/1996 | Blaker | |
| 5,612,964 A | 3/1997 | Haraszti | |
| 5,710,784 A | 1/1998 | Kindred | |
| 5,717,706 A | 2/1998 | Ikeda | |
| 5,802,118 A | 9/1998 | Bliss | |
| 5,844,945 A | 12/1998 | Nam | |
| 5,898,710 A | 4/1999 | Amrany | |
| 5,923,713 A | 7/1999 | Hatakeyama | |
| 5,978,414 A | 11/1999 | Nara | |
| 5,983,383 A | 11/1999 | Wolf | |
| 6,005,897 A | 12/1999 | McCallister et al. | |
| 6,023,783 A | 2/2000 | Divsalar | |
| 6,029,264 A | 2/2000 | Kobayashi | |
| 6,065,149 A | 5/2000 | Yamanaka | |
| 6,097,764 A | 8/2000 | McCallister | |
| 6,145,110 A | 11/2000 | Khayrallah | |
| 6,216,249 B1 | 4/2001 | Bliss | |

(Continued)

OTHER PUBLICATIONS

Leduc-Primeau et al., "A Relaxed Half-Stochastic Iterative Decoder for LDPC Codes", IEEE Communications Society, IEEE Globecom proceedings (2009).*

(Continued)

*Primary Examiner* — John Trimmings
(74) *Attorney, Agent, or Firm* — Hamilton DeSanctis & Cha (57) ABSTRACT

Various embodiments of the present invention provide systems and methods for stochastic stream decoding of binary LDPC codes. For example, a data decoder circuit is discussed that includes a number of variable nodes and check nodes, with serial connections between the variable nodes and the check nodes. The variable nodes are each operable to perform a real-valued computation of a variable node to check node message for each neighboring check node. The check nodes are operable to perform a real-valued computation of a check node to variable node message for each neighboring variable node. The messages are passed iteratively between the variable nodes and the check nodes.

20 Claims, 5 Drawing Sheets

(56) References Cited

U.S. PATENT DOCUMENTS

| | | |
|---|---|---|
| 6,216,251 B1 | 4/2001 | McGinn |
| 6,266,795 B1 | 7/2001 | Wei |
| 6,317,472 B1 | 11/2001 | Choi |
| 6,351,832 B1 | 2/2002 | Wei |
| 6,377,610 B1 | 4/2002 | Hagenauer |
| 6,381,726 B1 | 4/2002 | Weng |
| 6,473,878 B1 | 10/2002 | Wei |
| 6,535,553 B1 | 3/2003 | Limberg et al. |
| 6,625,775 B1 | 9/2003 | Kim |
| 6,748,034 B2 | 6/2004 | Hattori |
| 6,757,862 B1 | 6/2004 | Marianetti, II |
| 6,785,863 B2 | 8/2004 | Blankenship |
| 6,810,502 B2 | 10/2004 | Eidson |
| 6,970,511 B1 | 11/2005 | Barnette |
| 6,986,098 B2 | 1/2006 | Poeppelman |
| 7,047,474 B2 | 5/2006 | Rhee |
| 7,058,873 B2 | 6/2006 | Song |
| 7,073,118 B2 | 7/2006 | Greenberg |
| 7,093,179 B2 | 8/2006 | Shea |
| 7,117,427 B2 | 10/2006 | Ophir |
| 7,133,228 B2 | 11/2006 | Fung |
| 7,184,486 B1 | 2/2007 | Wu |
| 7,191,378 B2 | 3/2007 | Eroz |
| 7,203,887 B2 | 4/2007 | Eroz |
| 7,308,061 B1 | 12/2007 | Huang |
| 7,310,768 B2 | 12/2007 | Eidson |
| 7,313,750 B1 | 12/2007 | Feng |
| 7,370,258 B2 | 5/2008 | Iancu |
| 7,415,651 B2 | 8/2008 | Argon |
| 7,502,189 B2 | 3/2009 | Sawaguchi |
| 7,523,375 B2 | 4/2009 | Spencer |
| 7,587,657 B2 | 9/2009 | Haratsch |
| 7,590,168 B2 | 9/2009 | Raghavan |
| 7,646,829 B2 | 1/2010 | Ashley |
| 7,702,986 B2 | 4/2010 | Bjerke |
| 7,752,523 B1 | 7/2010 | Chaichanavong |
| 7,779,325 B2 | 8/2010 | Song |
| 7,802,172 B2 | 9/2010 | Vila Casado et al. |
| 7,952,824 B2 | 5/2011 | Dziak |
| 7,958,425 B2 | 6/2011 | Chugg et al. |
| 7,996,746 B2 | 8/2011 | Livshitz et al. |
| 8,018,360 B2 | 9/2011 | Nayak |
| 8,099,645 B2* | 1/2012 | Djordjevic et al. ........... 714/752 |
| 8,201,051 B2 | 6/2012 | Tan et al. |
| 8,237,597 B2 | 8/2012 | Liu et al. |
| 8,261,171 B2 | 9/2012 | Annampedu |
| 8,291,284 B2 | 10/2012 | Savin |
| 8,295,001 B2 | 10/2012 | Liu et al. |
| 2008/0069373 A1 | 3/2008 | Jiang |
| 2008/0077839 A1* | 3/2008 | Gross et al. ................... 714/755 |
| 2008/0304558 A1 | 12/2008 | Zhu et al. |
| 2009/0132893 A1 | 5/2009 | Miyazaki |
| 2009/0185643 A1 | 7/2009 | Fitzpatrick |
| 2009/0282320 A1* | 11/2009 | Liao et al. ..................... 714/784 |
| 2011/0138255 A1* | 6/2011 | Lee .............................. 714/777 |
| 2011/0167227 A1 | 7/2011 | Yang |
| 2011/0231731 A1* | 9/2011 | Gross et al. ................... 714/760 |
| 2011/0255612 A1* | 10/2011 | Bernstein et al. ............ 375/259 |
| 2011/0264987 A1 | 10/2011 | Li |
| 2011/0293045 A1* | 12/2011 | Gross et al. ................... 375/340 |
| 2012/0124118 A1 | 5/2012 | Ivkovic |
| 2012/0182643 A1 | 7/2012 | Zhang |
| 2012/0212849 A1 | 8/2012 | Xu |
| 2012/0262814 A1 | 10/2012 | Li |
| 2012/0265488 A1 | 10/2012 | Sun |

OTHER PUBLICATIONS

Saeed Sharifi Tehrani et al., An Area Efficient FPGA-Based Architecture for Fully-Parallel Stochastic LDPC Decoding, IEEE SiPS, 2007.*

Tehrani et al., "Fully Parallel Stochastic LDPC Decoders", IEEE Transactions on Signal Processing, vol. 56, No. 11 (Nov. 2008).*

Axvig et al., "Average Min-Sum Decoding of LDPC Codes", 5th International Symposium on Turbo Codes and Related Topics (2008).

Bahl et al., "Optimal decoding of linear codes for minimizing symbol error rate", IEEE Trans. Inform. Theory, vol. 20, pp. 284-287 (Mar. 1974).

Blaum, "High-Rate Modulation Codes for Reverse Concatenation", IEEE Transactions on Magnetics, vol. 43, No. 2 (Feb. 2007).

Casado et al., Multiple-rate low-density parity-check codes with constant blocklength, IEEE Transations on communications, Jan. 2009, vol. 57, pp. 75-83.

Cui et al., "High-Throughput Layered LDPC Decoding Architecture", IEEE Transactions on Very Large Scale Integration (VLSI) Systems, vol. 17, No. 4 (Apr. 2009).

Fan et al., "Constrained coding techniques for soft iterative decoders" Proc. IEEE Global Telecommun. Conf., vol. 1b, pp. 631-637 (1999).

Fossorier, Marc P.C. "Quasi-Cyclic Low-Density Parity-Check Codes From Circulant Permutation Maricies" IEEE Transactions on Information Theory, vol. 50, No. 8 Aug. 8, 2004.

Gross, "Stochastic Decoding of LDPC Codes over GF(q)", HDPCC Workshop, Tel Aviv (Mar. 2, 2010).

Gunnam et al., "VLSI Architectures for Layered Decoding for Irregular LDPC Codes of WiMax", IEEE ICC Proceedings (2007).

Hagenauer, J. et al A Viterbi Algorithm with Soft-Decision Outputs and its Applications in Proc. IEEE Globecom, pp. 47. 11-47 Dallas, TX Nov. 1989.

Han and Ryan, "Pinning Techniques for Low-Floor Detection/Decoding of LDPC-Coded Partial Response Channels", 5th International Symposium on Turbo Codes &Related Topics, 2008.

Kautz, "Fibonacci Codes for Synchronization Control", IEEE Trans. Info. Theory, vol. 11, No. 2, pp. 284-292 (Apr. 1965).

Kschischang et al., "Factor Graphs and the Sum-Product Algorithm", IEEE Transactions on Information Theory, vol. 47, No. 2 (Feb. 2001).

Lee et al., "Partial Zero-Forcing Adaptive MMSE Receiver for DS-CDMA Uplink in Multicell Environments" IEEE Transactions on Vehicular Tech. vol. 51, No. 5, Sep. 2002.

Li et al "Efficient Encoding of Quasi-Cyclic Low-Density Parity Check Codes" IEEE Transactions on Communications on 53 (11) 1973-1973, 2005.

Lim et al. "Convergence Analysis of Constrained Joint Adaptation in Recording Channels" IEEE Trans. on Signal Processing vol. 54, No. 1 Jan. 2006.

Lin et al "An efficient VLSI Architecture for non binary LDPC decoders"—IEEE Transaction on Circuits and Systems II vol. 57, Issue 1 (Jan. 2010) pp. 51-55.

Moon et al, "Pattern-dependent noise prediction in signal-dependent Noise," IEEE JSAC, vol. 19, No. 4 pp. 730-743, Apr. 2001.

Moon et al., "Maximum transition run codes for data storage systems", IEEE Trans. Magn., vol. 32, No. 5, pp. 3992-3994 (Sep. 1996).

Shokrollahi "LDPC Codes: An Introduction", Digital Fountain, Inc. (Apr. 2, 2003).

Spagnol et al, "Hardware Implementation of GF($2^m$) LDPC Decoders", IEEE Transactions on Circuits and Systemsṡi: Regular Papers, vol. 56, No. 12 (Dec. 2009).

Todd et al., "Enforcing maximum-transition-run code constraints and low-density parity check decoding", IEEE Trans. Magn., vol. 40, No. 6, pp. 3566-3571 (Nov. 2004).

U.S. Appl. No. 13/171,615, Unpublished (filed Jun. 29, 2011) (Bradley D. Seago).

U.S. Appl. No. 13/113,219, Unpublished (filed May 23, 2011) (Yang Han).

Vasic, B., "High-Rate Girth-Eight Codes on Rectangular Integer Lattices", IEEE Trans. Communications, vol. 52, Aug. 2004, pp. 1248-1252.

Vasic, B., "High-Rate Low-Density Parity-Check Codes Based on Anti-Pasch Affine Geometries," Proc ICC 2002, pp. 1332-1336.

(56) References Cited

OTHER PUBLICATIONS

Weon-Cheol Lee et al., "Vitierbi Decoding Method Using Channel State Info. in COFDM System" IEEE Trans. on Consumer Elect., IEEE Service Center, NY, NY vol. 45, No. 3 Aug. 1999.

Yeo et al., "VLSI Architecture for Iterative Decoders in Magnetic Storage Channels", Mar. 2001, pp. 748-755, IEEE trans. Magnetics, vol. 37, No. 2.

Zhang et al., "Analysis of Verification-Based Decoding on the q-ary Symmetric Channel for Large q", IEEE Trans. on Information Theory, vol. 57, No. 10 (Oct. 2011).

Zhong et al., "Design of VLSI Implementation-Oriented LDPC Codes", IEEE, pp. 670-673, 2003.

Zhong et al., "High-Rate Quasi-Cyclic LDPC Codes for Magnetic Recording Channel with Low Error Floor", ISCAS, IEEE pp. 3546-3549, May 2006.

Zhong et al., "Joint Code-Encoder Design for LDPC Coding System VLSI Implementation", ISCAS, IEEE pp. 389-392, May 2004.

Zhong et al., "Quasi Cyclic LDPC Codes for the Magnetic Recording Channel: Code Design and VSLI Implementation", IEEE Transactions on Magnetics, v. 43, pp. 1118-1123, Mar. 7.

Zhong, "Block-LDPC: A Practical LDPC Coding System Design Approach", IEEE Trans. on Circuits, Regular Papers, vol. 5, No. 4, pp. 766-775, Apr. 2005.

\* cited by examiner

STOCHASTIC STREAM DECODING OF BINARY LDPC CODES

BACKGROUND

Various embodiments of the present invention are related to systems and methods for decoding data, and more particularly to systems and methods for stochastic stream decoding of binary low density parity check (LDPC) codes.

Digital information storage and transmission has become ubiquitous in practically every facet of life throughout most of the world. Various data transfer systems have been developed including storage systems, cellular telephone systems, and radio transmission systems. In each of the systems data is transferred from a sender to a receiver via some medium. For example, in a storage system, data is sent from a sender (i.e., a write function) to a receiver (i.e., a read function) via a storage medium. As information is stored and transmitted in the form of digital data, errors are introduced that, if not corrected, can corrupt the data and render the information unusable. The effectiveness of any transfer is impacted by any losses in data caused by various factors. Many types of error checking systems have been developed to detect and correct errors in digital data. For example, in perhaps the simplest system, a parity bit can be added to a group of data bits, ensuring that the group of data bits (including the parity bit) has either an even or odd number of ones. When using odd parity, as the data is prepared for storage or transmission, the number of data bits in the group that are set to one are counted, and if there is an even number of ones in the group, the parity bit is set to one to ensure that the group has an odd number of ones. If there is an odd number of ones in the group, the parity bit is set to zero to ensure that the group has an odd number of ones. After the data is retrieved from storage or received from transmission, the parity can again be checked, and if the group has an even parity, at least one error has been introduced in the data. At this simplistic level, some errors can be detected but not corrected.

Figure 1:
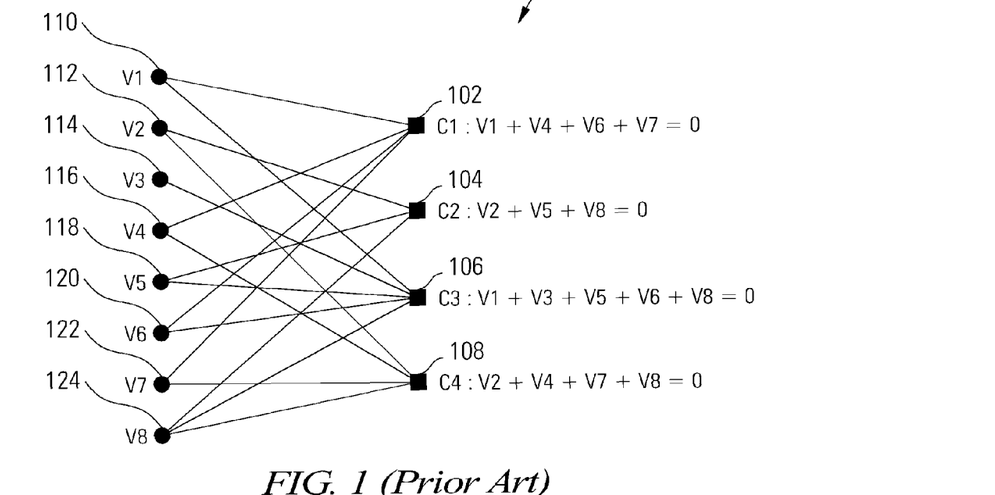
FIG. 1 depicts a Tanner graph of an example prior art LDPC code.

The parity bit may also be used in error correction systems, including in LDPC decoders. An LDPC code is a parity-based code that can be visually represented in a Tanner graph 100 as illustrated in FIG. 1. In an LDPC decoder, multiple parity checks are performed in a number of check nodes 102, 104, 106 and 108 for a group of variable nodes 110, 112, 114, 116, 118, 120, 122, and 124. Variable nodes 110-124 contain values based on a group of data and parity bits that are retrieved from a storage device, received by a transmission system or obtained in some other way. The number and placement of parity bits in the group are selected as the LDPC code is designed. The connections (or edges) between variable nodes 110-124 and check nodes 102-108 are also selected as the LDPC code is designed, balancing the strength of the code against the complexity of the decoder required to execute the LDPC code as data is obtained. The connections between variable nodes 110-124 and check nodes 102-108 may be presented in matrix form as follows, where columns represent variable nodes, rows represent check nodes, and a 1 at the intersection of a variable node column and a check node row indicates a connection between that variable node and check node:

$$H = \begin{bmatrix} 1 & 0 & 0 & 1 & 0 & 1 & 1 & 0 \\ 0 & 1 & 0 & 0 & 1 & 0 & 0 & 1 \\ 1 & 0 & 1 & 0 & 1 & 1 & 0 & 1 \\ 0 & 1 & 0 & 1 & 0 & 0 & 1 & 1 \end{bmatrix}$$

By providing multiple check nodes 102-108 for the group of variable nodes 110-124, redundancy in error checking is provided, enabling errors to be corrected as well as detected. Each check node 102-108 performs a parity check on bits passed as messages from its neighboring (or connected) variable nodes. In the example LDPC code corresponding to the Tanner graph 100 of FIG. 1, check node 102 checks the parity of variable nodes 110, 116, 120 and 122. Values are passed back and forth between connected variable nodes 110-124 and check nodes 102-108 in an iterative process until the LDPC code converges on a value for the group of data and parity bits in the variable nodes 110-124. For example, variable node 110 passes messages to check nodes 102 and 106. Check node 102 passes messages back to variable nodes 110, 116, 120 and 122. The messages between variable nodes 110-124 and check nodes 102-108 are probabilities or beliefs, thus the LDPC decoding algorithm is also referred to as a belief propagation algorithm. Each message from a node represents the probability that a bit has a certain value based on the current value of the node and on previous messages to the node.

A message from a variable node to any particular neighboring check node is computed using any of a number of algorithms based on the current value of the variable node and the last messages to the variable node from neighboring check nodes, except that the last message from that particular check node is omitted from the calculation to prevent positive feedback. Similarly, a message from a check node to any particular neighboring variable node is computed, generally by an XOR function, based on the current value of the check node and the last messages to the check node from neighboring variable nodes, except that the last message from that particular variable node is omitted from the calculation to prevent positive feedback. As iterations are performed in the system, messages pass back and forth between variable nodes 110-124 and check nodes 102-108, with the values in the nodes 102-124 being adjusted based on the messages that are passed, until the values converge and stop changing or until processing is halted.

BRIEF SUMMARY

Various embodiments of the present invention are related to systems and methods for systems and methods for decoding data, and more particularly to systems and methods for stochastic stream decoding of binary LDPC codes.

Various embodiments of the present invention provide systems and methods for stochastic stream decoding of binary LDPC codes. For example, a data decoder circuit is discussed that includes a number of variable nodes and check nodes, with serial connections between the variable nodes and the check nodes. The variable nodes are each operable to perform a real-valued computation of a variable node to check node message for each neighboring check node. The check nodes are operable to perform a real-valued computation of a check node to variable node message for each neighboring variable node. The messages are passed iteratively between the variable nodes and the check nodes. In various combinations of embodiments, the data decoder circuit is an LDPC decoder, implemented as an integrated circuit and incorporated in a storage device or a data transmission device. In some embodiments, the variable nodes and the check nodes are operable to send the messages as stochastic bit streams. In some cases, the stochastic bit streams represent real probability values as a mean of successive random binary values. In some cases, the variable nodes and check nodes are operable to convert the messages from stochastic bit streams to probability values. In some embodiments, the variable nodes and the check nodes each include a tracking filter operable to calculate an exponential moving average of messages. In some of the aforementioned embodiments, the variable nodes are operable to implement a belief propagation decoding algorithm, and the check nodes are operable to implement a min-sum decoding algorithm.

Other embodiments of the present invention provide methods for decoding binary low density parity check codes. The methods include iteratively passing stochastic bit streams between variable nodes and check nodes in a low density parity check decoder, converting the stochastic bit streams to probability values in the variable nodes and check nodes, and performing real value calculations in the variable nodes and check nodes based at least in part on the probability values. The real-value calculations in some embodiments comprise a min-sum operation in the check nodes, which may be performed in a log likelihood ratio domain. Some embodiments of the methods convert the stochastic bit streams to probability values by filtering the stochastic bit streams with an exponential moving average. Some embodiments also include converting the probability values to log likelihood ratios in the variable nodes and check nodes, and converting log likelihood ratios in the variable nodes and check nodes to the stochastic bit streams. The stochastic bit streams in some embodiments are serial bit streams. In some embodiments, the methods convert the log likelihood ratios by generating random numbers in the variable nodes and the check nodes, converting the random numbers to random log likelihood ratios, and comparing the log likelihood ratios to the random log likelihood ratios to yield the stochastic bit streams.

Yet other embodiments of the present invention provide storage systems including a storage medium, a read/write head assembly operable to sense a data set on the storage medium and to provide an analog signal corresponding to the data set, an analog to digital converter operable to sample the analog signal to yield a digital data stream, and a low density parity check decoder operable to decode the digital data stream. The low density parity check decoder includes a number of variable nodes and check nodes operable to transmit stochastic bit streams between each other. In some cases, the variable nodes and check nodes are operable to perform floating point operations based on the stochastic bit streams.

This summary provides only a general outline of some embodiments according to the present invention. Many other objects, features, advantages and other embodiments of the present invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals may be used throughout several drawings to refer to similar components. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

Various embodiments of the present invention are related to systems and methods for decoding data, and more particularly to systems and methods for stochastic stream decoding of binary LDPC codes.

Various embodiments of the present invention provide for low-complexity, iterative stochastic stream decoding of binary LDPC codes. In contrast with traditional decoding algorithms that implement variable and check node operations using simple logic functions, stochastic stream decoding implements these operations as floating point operations, resulting in a significant improvement in the performance of the decoder. Stochastic streams are used to transfer messages along edges between variable nodes (e.g., 110) and check nodes (e.g., 102) using single bit streams to propagate in a belief propagation. The nodes estimate the real-valued messages represented by the single incoming bit, and the estimates are used to generate an accurate estimate for an outgoing message. Thus, floating point estimations are performed in both variable nodes and check nodes, with stochastic streams used to pass messages between variable nodes and check nodes in both directions.

The term "stochastic stream" is used herein to refer to a random stream of bits whose mean represents a probability or a node's belief about its true value. For example, to transmit a message from a variable node indicating a 75% probability that the bit in the variable node is a 1 (and thus a 25% probability that the bit is a 0), a random stream of 0s and 1s transmitted by the variable node, where 75% percent of the time a 1 is sent in the stream and 25% of the time a 0 is sent.

Note that the term "random" is not intended to indicate that the bit stream is necessarily truly randomized. The values in the bit stream are determined at least to some extent by the message to be transmitted by the bit stream. However, it is primarily the mean value of the bit stream that carries the information, rather than the order of 1s and 0s, and as will be described below, a random number generator may be used in some embodiments in the generation of the stochastic bit stream.

The receiving check node collects a set of bits from the stream, for example, but not limited to, 5 or 10 bits. The check node then converts the set of bits to a floating point number to be used in the decoding operation in the check node to calculate outgoing message values. Thus, by passing messages between variable nodes and check nodes and vice versa in stochastic streams, a real-valued floating point decoding algorithm such as min-sum or belief propagation can be implemented in both variable nodes and check nodes, while retaining single wire connections between nodes in each direction rather than bulky parallel connections between nodes.

The conversion of bits in a stochastic stream to a floating point number can be performed by a tracking scheme in which a current estimate of the message value is adjusted up or down with each received bit. The actual message value is quantized in the stochastic stream based on the number of bits selected to represent each message, and the number of consecutive bits used per message may be adapted based on the desired granularity.

Figure 2A:
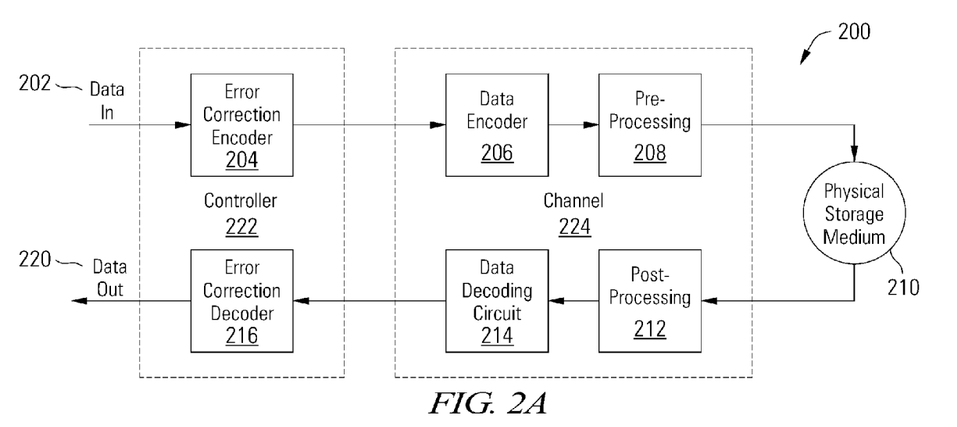
FIG. 2A depicts an example data storage system using a data decoder with evaluation/debugging interface in accordance with some embodiments of the present invention.

Turning to FIG. 2A, a storage system 200 including a data decoding circuit 214 with an LDPC stochastic stream decoder is shown in accordance with some embodiments of the present invention. Storage system 200 includes a controller 222, a channel 224, and a physical storage medium 210. Physical storage medium 210 may be, but is not limited to, a magnetic disk. Based on the disclosure provided herein, one of ordinary skill in the art will recognize a variety of physical storage media that may be used in relation to different embodiments of the present invention. Controller 222 includes error correction encoding and decoding. In particular, controller 222 includes an error correction encoder 204. Error correction encoder 204 may be any error correction encoder known in the art including, but not limited to, a Reed Solomon encoder or a CRC encoder, and error correction decoder 216 may be, but is not limited to, a corresponding Reed Solomon decoder or CRC decoder. Both the aforementioned encoder and decoder may be any circuit or system known in the art that is capable of performing encoding and decoding processes. Channel 224 includes a data encoder 206 and a pre-processing circuit 208. In some cases, data encoder 206 is an LDPC encoder. Based on the disclosure provided herein, one of ordinary skill in the art will recognize a variety of encoding processes and corresponding decoding processes that may be implemented in accordance with different embodiments of the present invention. Pre-processing circuit 208 includes the various pre-processing circuitry that is well known in the art. Post-processing circuit 212 includes the various post-processing circuitry that is well known in the art for receiving data from a physical storage medium and for preparing the received data for data detection and decoding.

In addition, channel 224 includes data decoding circuit 214 that is capable of performing a variable number of detection and decoding iterations depending upon processing availability and/or convergence. Such a data decoding circuit 214 allows for performing a variable number of iterations on a given input, while minimizing the number of iterations that must be performed.

During operation of the storage system 200, a data input 202 is received. Data input 202 may be any data set destined for storage on physical storage medium 210. Data input 202 is encoded using error correction encoder 204 as is known in the art. The output of error correction encoder 204 is provided to data encoder 206 that may, for example, perform an LDPC encoding of the data. The output of data encoder 206 is provided to pre-processing circuit 208 that may convert the output from a digital output to an analog output satisfactory for writing to physical storage medium 210.

The data previously written to physical storage medium 210 may be subsequently retrieved and processed by post-processing circuit 212. In one case, post-processing circuit 212 performs an amplification of an analog data signal retrieved from physical storage medium 210, and converts the amplified analog signal to a digital signal that is output to data decoding circuit 214. In turn, data decoding circuit 214 performs a variable number of data detection and data decoding processes until either the output of the processes converges (i.e., it adequately represents the original data encoded by data encoder 206) or until insufficient resources remain to perform additional processing. Data decoding circuit 214 provides its result as an output to error correction decoder 216. Error correction decoder 216 performs the designated error correction processing to determine whether any errors remain and if detected, attempts to correct the errors. Once the error correction processes are completed, error correction decoder 216 provides a data output 220. In general, data output 220 corresponds to data input 202 that was originally provided for writing to physical storage medium 210.

The data decoding circuit 214 includes an LDPC stochastic stream decoder using stochastic streams between variable and check nodes and between check nodes and variable nodes, enabling the use of floating point decoding algorithms in both variable nodes and check nodes. This provides a significant improvement in the performance of the decoder over traditional decoders, for example reducing the frame error rate for a given signal to noise ratio, without the need for parallel connections between variable and check nodes which would greatly increase circuit size.

Figure 2B:
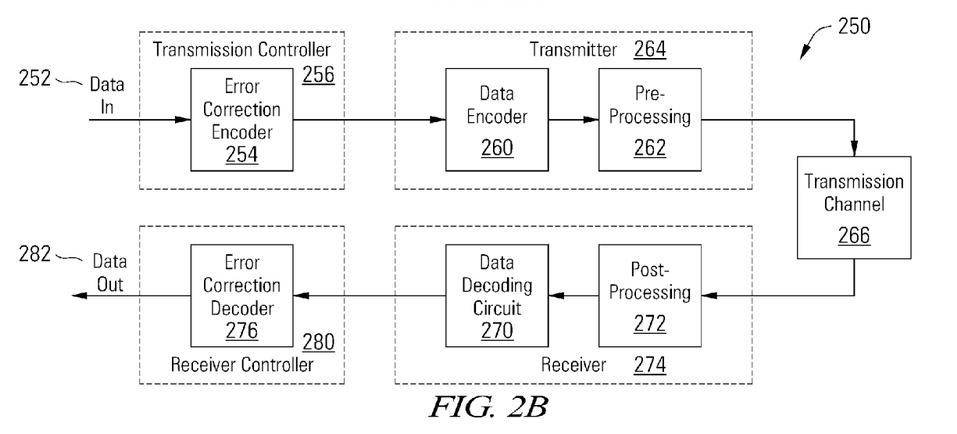
FIG. 2B depicts an example data transfer system using a data decoder with evaluation/debugging interface in accordance with some embodiments of the present invention.

Turning to FIG. 2B, a transmission system 250 including a data decoding circuit 270 with an LDPC stochastic stream decoder is depicted in accordance with some embodiments of the present invention. Transmission system 250 includes a transmission controller 256, a transmitter 264, a transmission channel 266, a receiver 274, and a receiver controller 280. Transmission channel may be, but is not limited to, an RF transmission channel. Based on the disclosure provided herein, one of ordinary skill in the art will recognize a variety of transmission channels that may be used in relation to different embodiments of the present invention. Transmission controller 256 includes an error correction encoder 254 that may be implemented, for example, as a Reed Solomon encoder or a CRC encoder. Similarly, receiver controller 280 includes an error correction decoder 276 corresponding to error correction encoder 254. Thus, error correction decoder 276 may be, for example, a CRC decoder or a Reed Solomon decoder. Both the aforementioned encoder and decoder may be any circuit or system known in the art that is capable of performing encoding and decoding processes. Based on the disclosure provided herein, one of ordinary skill in the art will recognize a variety of error correction encoder/decoder approaches that may be used in relation to different embodiments of the present invention.

Transmitter 264 includes a data encoder 260 and a pre-processing circuit 262. In some cases, data encoder 260 is an LDPC encoder. Based on the disclosure provided herein, one of ordinary skill in the art will recognize a variety of encoding processes that may be implemented in accordance with different embodiments of the present invention. Pre-processing circuit 262 includes the various pre-processing circuitry that is well known in the art. In one particular case, pre-processing circuit 262 is operable to convert a digital data set from data encoder 260 to a corresponding RF signal suitable for transmission via transmission channel 266. The data set transferred via transmission channel 266 is received using a post-processing circuit 272 of receiver 274. Post-processing circuit 272 includes the various post-processing circuitry that is well known in the art for receiving data from a transmission channel and for preparing the received data for data detection and decoding.

In addition, receiver 274 includes data decoding circuit 270 that is capable of performing a variable number of detection and decoding iterations depending upon processing availability and/or convergence, using an LDPC stochastic stream decoder. Such a data decoding circuit 270 allows for performing a variable number of iterations on a given input.

In operation, a data input 252 is received. Data input 252 may be any data set destined for transmission via transmission channel 266. Data input 252 is encoded using error correction encoder 254 as is known in the art. The output of error correction encoder 254 is provided to data encoder 260 that may, for example, perform an LDPC encoding of the data. The output of data encoder 260 is provided to pre-processing circuit 262 that may convert the output from a digital output to an analog output satisfactory for transmission via transmission channel 266.

The data transmitted via transmission channel 266 is received and processed by post-processing circuit 272 of receiver 274. In one case, post-processing circuit 272 performs an amplification of an analog data signal retrieved from transmission channel 266, and converts the amplified analog signal to a digital signal that is output to data decoding circuit 270. In turn, data decoding circuit 270 performs a variable number of data detection and data decoding processes until either the output of the processes converges (i.e., it adequately represents the original data encoded by data encoder 260) or until insufficient resources remain to perform additional processing. Data decoding circuit 270 provides its result as an output to error correction decoder 276. Error correction decoder 276 performs the designated error correction processing to determine whether any errors remain and if detected, attempts to correct the errors. Once the error correction processes are completed, error correction decoder 276 provides a data output 282. In general, data output 282 corresponds to data input 252 that was originally provided for transmission via transmission channel 266.

As in the storage system 200 of FIG. 2B, the data decoding circuit 270 of transmission system 250 includes an LDPC stochastic stream decoder using stochastic streams between variable and check nodes and between check nodes and variable nodes, enabling the use of floating point decoding algorithms in both variable nodes and check nodes. This provides a significant improvement in the performance of the decoder over traditional decoders, for example reducing the frame error rate for a given signal to noise ratio, without the need for parallel connections between variable and check nodes which would greatly increase circuit size.

It should be noted that while FIGS. 2A and 2B depict a storage system and a transmission system to which systems and methods for stochastic stream decoding of binary LDPC codes may be applied, there are a variety of systems in which stochastic stream decoding of binary LDPC codes in accordance with different embodiments of the present invention may be applied. Based on the disclosure provided herein, one of ordinary skill in the art will recognize a variety of systems that may be benefited by use of systems and methods for stochastic stream decoding of binary LDPC codes in accordance with different embodiments of the present invention.

Figure 3:
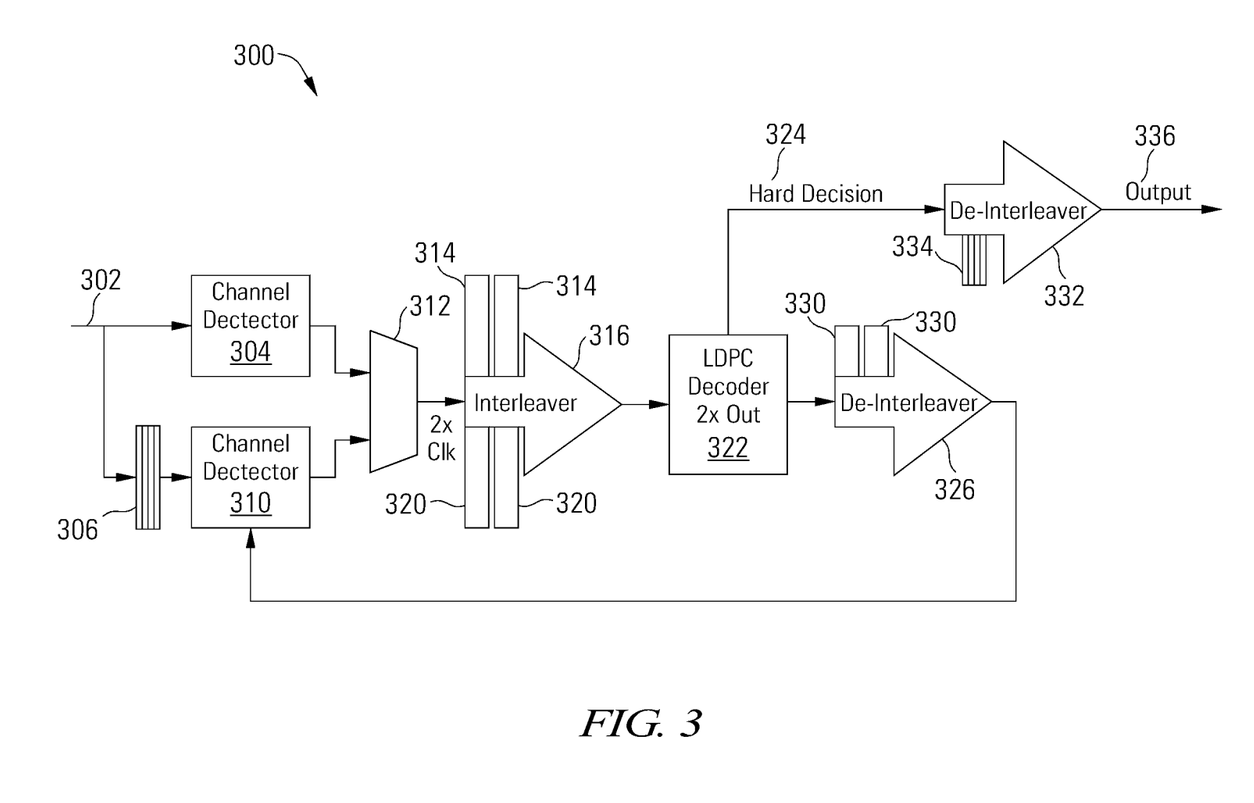
FIG. 3 depicts a data detection and decoding circuit with evaluation/debugging interface in accordance with various embodiments of the present invention.

Turning to FIG. 3, one implementation of a data decoding circuit 300 that may include an LDPC stochastic stream decoder 322 and that may be used in place of the data decoding circuit 214 and data decoding circuit 270 of FIGS. 2A and 2B is depicted in accordance with some embodiments of the present invention. Data decoding circuit 300 includes a data input 302 that is fed to a channel detector 304. Channel detector 304 may be any type of channel detector known in the art including, but not limited to, a soft output Viterbi algorithm detector (SOVA) or a maximum a posteriori (MAP) detector. Based on the disclosure provided herein, one of ordinary skill in the art will recognize a variety of channel detectors that may be used in accordance with different embodiments of the present invention. In addition, data input 302 is provided to an input data buffer 306 that is designed to hold a number of data sets received from data input 302. The size of input data buffer 306 may be selected to provide sufficient buffering such that a data set input via data input 302 remains available at least until a first iteration processing of that same data set is complete and the processed data is available in a ping pong buffer 330 (i.e., a queuing buffer) as more fully described below. Input data buffer 306 provides the data sets to a channel detector 310. Similar to channel detector 304, channel detector 310 may be any type of channel detector known in the art including, but not limited to, a SOVA detector or a MAP detector. Again, based on the disclosure provided herein, one of ordinary skill in the art will recognize a variety of channel detectors that may be used in accordance with different embodiments of the present invention.

The output of both channel detector 304 and channel detector 310 are provided to an interleaver circuit 316 via a multi-plexer 312. Such outputs may be, for example, log likelihood ratio values. Interleaver circuit 316 interleaves the output of channel detector 304 and separately interleaves the output of channel detector 310 using two ping pong buffers 314, 320. One of the buffers in ping pong buffer 314 holds the result of a prior interleaving process of the output from channel detector 304 and is unloaded to LDPC stochastic stream decoder 322, while the other buffer of ping pong buffer 314 holds a data set from channel detector 304 that is currently being interleaved. Similarly, one of the buffers in ping pong buffer 320 holds the result of a prior interleaving process of the output from channel detector 310 and is unloaded to LDPC stochastic stream decoder 322, while the other buffer of ping pong buffer 320 holds a data set from channel detector 310 that is currently being interleaved.

LDPC stochastic stream decoder 322 is capable of decoding one or more data sets simultaneously. As an example, LDPC stochastic stream decoder 322 may be designed to decode an interleaved data set from ping pong buffer 314, or an interleaved data set from ping pong buffer 320, or to decode interleaved data sets from ping pong buffer 314 and ping pong buffer 320 simultaneously. The decoded data is either provided as a hard decision output 324 and/or to a de-interleaver circuit 326 that uses ping pong buffer 330 to de-interleave the decoded data and to provide the de-interleaved data as an input to channel detector 310. One of the buffers in ping pong buffer 330 holds the result of a prior de-interleaving process and is unloaded to channel detector 310, while the other buffer of ping pong buffer 330 holds a decoded data set currently being de-interleaved. Hard decision output 324 is provided to a de-interleaver circuit 332 that de-interleaves hard decision output 324 and stores the de-interleaved result in an output data buffer 334. Ultimately, de-interleaver circuit 332 provides the de-interleaved data stored in output data buffer 334 as an output 336.

In normal operation, a first data set is introduced via data input 302 to channel detector 304. Channel detector 304 performs its channel detection algorithm and provides both a hard output and a soft output to multiplexer 312. The hard and soft decision data is written to one buffer of ping pong buffer 314. At the same time the detector output is written into the buffer, interleaver 316 interleaves the data set by writing consecutive data into non-consecutive memory/buffer addresses based on the interleaver algorithm/mapping. Once interleaver 316 completes its interleaving process, the interleaved data is decoded by LDPC stochastic stream decoder 322. Where the data converges, LDPC stochastic stream decoder 322 writes its output as hard decision output 324 to output data buffer 334 and the processing is completed for that particular data set. Alternatively, where the data does not converge, LDPC stochastic stream decoder 322 writes its output (both soft and hard) to ping pong buffer 330.

The data written to ping pong buffer 330 is fed back to channel detector 310. Channel detector 310 selects the data set that corresponds to the output in ping pong buffer 330 from input data buffer 306 and performs a subsequent data detection aided by the soft output data generated by LDPC stochastic stream decoder 322 fed back from ping pong buffer 330. By using the previously generated soft data for data maintained in input data buffer 306, channel detector 310 generally performs a subsequent channel detection with heightened accuracy. The output of this subsequent channel detection is passed to interleaver 316 via multiplexer 312. The data is written to one buffer of ping pong buffer 320, and interleaver 316 interleaves the data. The interleaved data is then passed to LDPC stochastic stream decoder 322 where it is decoded a second time. Similar to the first iteration, a decision is made as to whether the data converged or whether there is insufficient space in ping pong buffer 330 to handle the data. Where such is the case, LDPC stochastic stream decoder 322 writes its output as hard decision output 324 to output data buffer 334 and the processing is complete for that particular data set. Alternatively, where the data does not converge and there is sufficient buffer space in ping pong buffer 330 to receive an additional data set, LDPC stochastic stream decoder 322 writes its output (both soft and hard) to ping pong buffer 330 where it is passed back to channel detector 310 for a third pass. Sufficient space is defined in ping pong buffer 330 by having at least reserved space for the data set from the first detector and decoder iteration after the data set from the second detector and decoder iteration is written into the ping pong buffer 330.

It should be noted that, as an example, a first data set may be applied at data input 302 and that it takes a number of iterations to converge while all subsequent data sets applied at data input 302 converge on the first pass (i.e., on a single iteration). In such a case, the first data set may be processed a number of times (i.e., a number of global iterations) that is limited by the amount of memory available in output data buffer 334. The term "global iteration" is used herein to refer to data passing from a detector (e.g., 304, 310) to the LDPC stochastic stream decoder 322. The term "local iteration" is used herein to refer to a stage of processing internally in the LDPC stochastic stream decoder 322, for example when data is passed from variable nodes 110-124 (FIG. 1), to check nodes 102-108 and back to variable nodes 110-124. Once output data buffer 334 is full or once an ordered set of outputs are available, the most recent hard decision output corresponding to the first data set is provided as a hard decision output and de-interleaver 334 re-orders the outputs putting the first output in the first position. With this done, output data buffer 334 is flushed out as output 336. In some embodiments of the present invention, de-interleaver 332 does not perform a re-ordering function and output data buffer 334 has a very limited size. In such a case, it is conceivable that a data set could be processed a very large number times (i.e., a large number of iterations) only limited by how long a recipient of output 336 is willing to wait for the data. As another example, it is possible that all data applied as data input 302 converges on its first pass. In such a case, channel detector 310, LDPC stochastic stream decoder 322 and/or de-interleaver 326 may be placed in a power saving mode to conserve power. As yet another example, it may be the case that all data sets applied at data input 302 fail to converge on the first pass (i.e., a single iteration). In such a case, all data sets would be iterated twice. It should also be noted that one or more additional channel detectors may be added along with additional space in ping pong buffers 314, 320, 330 that would facilitate more iterations in the situation where a significant number of closely located data sets fail to converge. In such cases, all data sets can be guaranteed to be decoded with the same number of iterations as the number of detectors.

Figure 4:
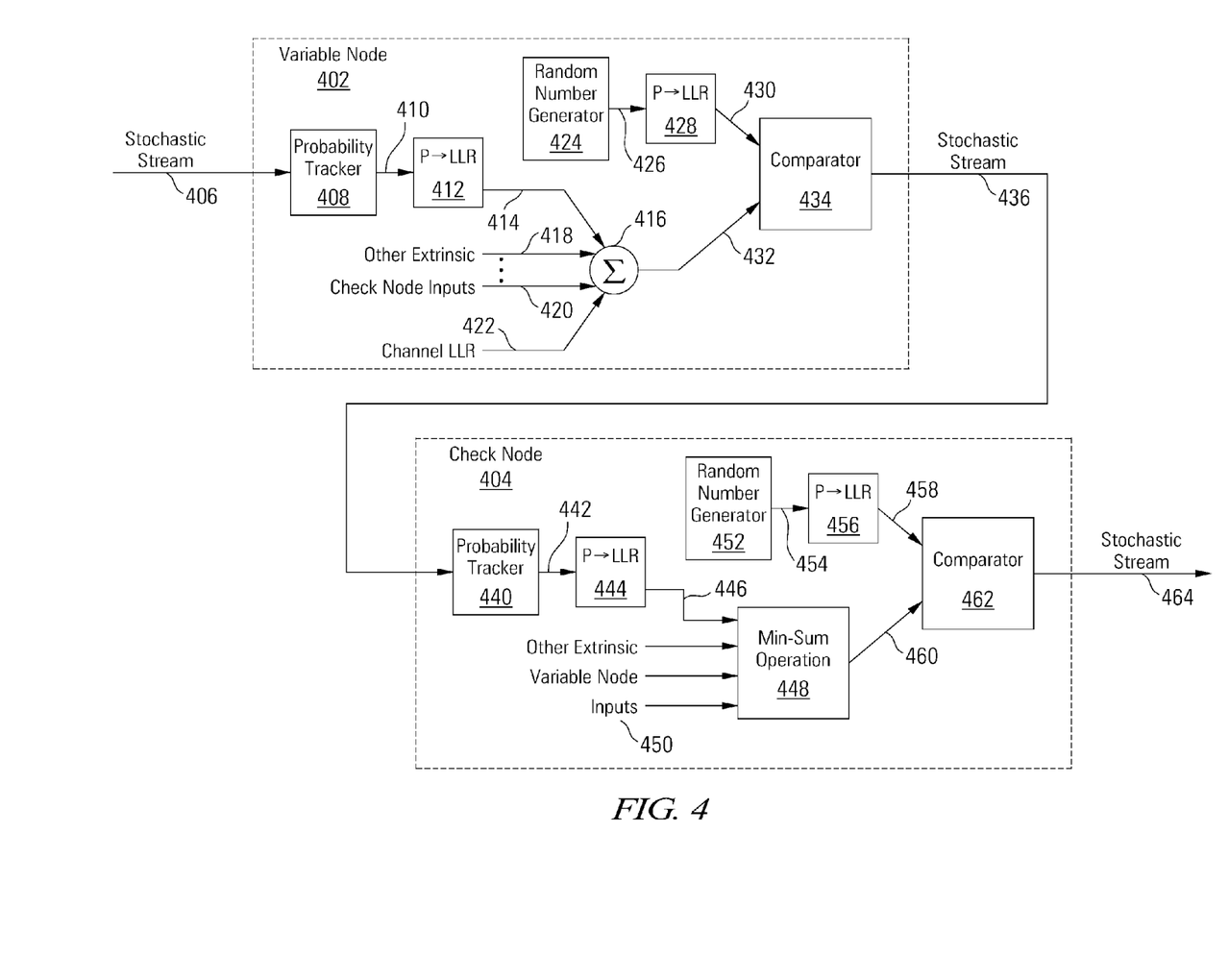
FIG. 4 depicts a block diagram of variable node and check node operation in accordance with various embodiments of the present invention.

Turning to FIG. 4, the operation of a variable node 402 and a check node 404 in an LDPC stochastic stream decoder is depicted in accordance with some embodiments of the present invention. While the full circuit topology showing the interconnections between processing units implementing the multiple variable nodes and check nodes is not shown, the LDPC stochastic stream decoder is not limited to any particular topology and may be adapted to meet the requirements of any number of specific applications. Based on the disclosure provided herein, one of ordinary skill in the art will recognize a variety of LDPC circuits that may be adapted to stochastic stream decoding, both currently known and that may be developed in the future.

Generally, the message from a variable node (e.g., 402) to a check node (e.g., 404) is the probability that the variable node (e.g., 402) or the bit associated with the variable node 402 has a certain value based on the observed value of the bit and on all the messages from neighboring check nodes in a prior round other than the check node (e.g., 404) for which the message is prepared. (These prior round messages from neighboring check nodes, excluding the neighboring check node for which the current message is being prepared, are referred to as extrinsic inputs.) The message from a check node (e.g., 404) to a variable node (e.g., 402) is the probability that the destination variable node (e.g., 402) has a certain value given all the prior round messages passed to check node (e.g., 404) from neighboring variable nodes other than the destination variable node (e.g., 402).

The extrinsic inputs for a message from variable node 402 to check node 404 are all messages from other check nodes neighboring (connected to) variable node 402, but excluding the message from check node 404 to avoid positive feedback. This prevents a message to check node 404 from being based on the last message from check node 404. For example, turning to FIG. 1, when variable node 124 prepares a message to check node 106, the extrinsic inputs upon which the variable node 124 bases the message are the edges or messages from check node 104 and check node 108, but not the edge from check node 106. The variable node 402 thus prepares a different message for each neighboring check node, using the different set of extrinsic inputs for each message based on the destination check node.

The variable node 402 is provided with a stochastic bit stream 406 that is fed to a probability tracker 408. Probability tracker 408 provides a probability value 410 representing the stochastic bit stream 406 to a log likelihood ratio (LLR) converter 412. The LLR value 414 resulting from stochastic bit stream 406 is fed to a summation circuit 416 along with LLR values 418, 420 from other extrinsic inputs, and a channel LLR 422. (LLR values 418, 420 are formed from stochastic streams from other neighboring check nodes, converted to probabilities in probability trackers and then to the LLR domain in LLR converters, similarly to LLR value 414, although the additional probability trackers and LLR converters are not shown to avoid complexity in FIG. 4.) The channel LLR 422 is the observed value of the bit associated with the variable node 402, such as, but not limited to, the bit as read from the physical storage medium 210 or transmission channel 266.

A random number generator 424 provides a random number 426 to a log likelihood converter 428 to yield a random number in the LLR domain 430. The output message 432 from the summation circuit 416 and the random number in the LLR domain 430 are compared in comparator 434 to produce an output message to check node 404 in the form of a stochastic bit stream 436.

The check node 404 is provided with the stochastic bit stream 436 from variable node 402 in the example of FIG. 4. The stochastic bit stream 436 is fed to probability tracker 440. Probability tracker 440 provides a probability value 442 to log likelihood ratio converter 444. The LLR value 446 is fed to a min-sum circuit 448, along with other extrinsic variable node inputs 450. LLR values 450 are formed from stochastic streams from other neighboring variable nodes, converted to probabilities in probability trackers and then to the LLR domain in LLR converters, similarly to LLR value 446, although the additional probability trackers and LLR converters are not shown to avoid complexity in FIG. 4.

A random number generator 452 provides a random number 454 to a log likelihood converter 456 to yield a random number in the LLR domain 458. The output message 460 from the min-sum circuit 448 and the random number in the LLR domain 458 are compared in comparator 462 to produce an output message in the form of a stochastic bit stream 464.

Notably, the message 464 from check node 404 will not be destined for variable node 402, because it includes the stochastic bit stream 436 in its calculation, which is not one of the extrinsic inputs to check node 404 for a message to variable node 402. Similarly, stochastic bit stream 406 will have come to variable node 402 from a neighboring check node other than check node 404, because a message from check node 404 is not an extrinsic input to variable node 402 when preparing a message to check node 404.

In operation, stochastic bit stream 406 is received in probability tracker 408 which accumulates bits from the stochastic bit stream 406 to generate a real-valued or floating point probability value 410, adjusting the resulting probability value up or down as each 1 or 0 is received. This is converted in log likelihood converter 412 to an LLR value, using an algorithm such as that in Equation 1 below:

$$LLR(x) = \log\left(\frac{x}{(1-x)}\right) \qquad \text{Equation 1}$$

The summation circuit 416 sums the LLR values from all extrinsic inputs (e.g., 414, 418, 420). The comparator 434 converts the output message 432 to a stochastic bit stream 436 by comparing the output message 432 with a uniform random number in the LLR domain, generated by the random number generator 424 and log likelihood ratio converter 428. The random number generator 424 is adapted such that the LLR random number 430 and the LLR output message 432 have the same range. The random number generator 424 generates a new random number for each bit to be output in the stochastic bit stream 436. If the LLR output message 432 is greater than the LLR random number 430, the comparator 434 outputs a 1. If the LLR output message 432 is less than the LLR random number 430, the comparator 434 outputs a 0. Thus, for example, if the LLR output message 432 represents a 75% probability that the value of the variable node 402 is a 1, about ¾ of the LLR random numbers 430 will be less than the LLR output message 432, resulting in a 1 from the comparator 434 about 75% of the time. As the LLR values 430 and 432 are compared in comparator 434 to generate stochastic bit stream 436, the LLR values are converted to binary values, which are converted to probability values in probability tracker 440 and again to LLR values in log likelihood ratio converter 444.

In some embodiments, the random number comparison is performed in the probability domain rather than the LLR domain in the variable node 402 and the check node 404.

The stochastic bit stream 436 is passed from the variable node 402 to the check node 404 along a serial connection. In some embodiments, one wire is provided in each direction between a neighboring variable node 402 and check node 404, saving significant circuit area over fully parallel designs. The probability tracker 440 converts the stochastic bit stream 436 to a probability value 442 in the same manner as probability tracker 408. The probability value 442 is converted to an LLR value 446 using an algorithm such as that in Equation 1.

The extrinsic inputs to check node 404 are used in a real-value decoding algorithm to generate an LLR output message 460. The variable nodes and check nodes may implement any desired decoding algorithms such as, but not limited to, belief propagation algorithms and the min-sum operation performed in the min-sum circuit 448 of FIG. 4. The LLR output message 460 generated by min-sum circuit 448 is converted to a stochastic bit stream 464 using a random number generator 452, log likelihood converter 456 and comparator 462 as in the variable node 402.

In some embodiments, the probability tracker 408 and probability tracker 440 also include a first order tracking filter, applying an exponential moving average as bits are accumulated. For example, in some embodiments the probability tracker 408 in the variable node 402 updates the current probability value according to Equation 2 below as bits are received in the stochastic bit stream 406:

$$m_{c \to v}(i) = k_v \cdot (b_{c \to v}) + (1-k_v) \cdot m_{c \to v}(i-1) \qquad \text{Equation 2}$$

where $m_{c \to v}(i)$ is the current probability value in the probability tracker 408, $(b_{c \to v})$ is a bit in the incoming message in the stochastic bit stream 406, $m_{c \to v}(i-1)$ is the previous probability value in the probability tracker 408, and $k_v$ is the sensitivity factor in the tracking filter in the probability tracker 408. In some embodiments the probability tracker 440 in the check node 404 updates the current probability value according to Equation 3 below as bits are received in the stochastic bit stream 436:

$$m_{v \to c}(i) = k_c \cdot (b_{v \to c}) + (1-k_c) \cdot m_{v \to c}(i-1) \qquad \text{Equation 3}$$

where $m_{v \to c}(i)$ is the current probability value in the probability tracker 440, $(b_{v \to c})$ is a bit in the incoming message in the stochastic bit stream 436, $m_{v \to c}(i-1)$ is the previous probability value in the probability tracker 440, and $k_c$ is the sensitivity factor in the tracking filter in the probability tracker 440.

The sum function applied in the summation circuit 416 in the variable node 402 can be expressed in the probability domain as set forth in Equation 4:

$$\frac{Pr(0)}{Pr(1)} = \left(\frac{Pr_{C1}(0)}{Pr_{C1}(1)}\right)\left(\frac{Pr_{C2}(0)}{Pr_{C2}(1)}\right)\left(\frac{Pr_{obs}(0)}{Pr_{obs}(1)}\right) \quad \text{Equation 4}$$

where $\frac{Pr(0)}{Pr(1)}$ is the probability that the value of variable node 402 is 0 divided by the probability that the value of variable node 402 is 1 (referred to as a probability ratio), or the probability value of output message 432 in the probability domain.

$$\left(\frac{Pr_{C1}(0)}{Pr_{C1}(1)}\right)$$

is the probability ratio provided in an extrinsic message from a first neighboring check node, $$\left(\frac{Pr_{C2}(0)}{Pr_{C2}(1)}\right)$$

is the probability ratio provided in an extrinsic message from a second neighboring check node, and $$\left(\frac{Pr_{obs}(0)}{Pr_{obs}(1)}\right)$$

is the probability ratio of the observed value in the variable node 402, based on the value read from a data channel and provided to the variable node 402. A probability ratio will be included in Equation 4 for each extrinsic message from neighboring check nodes.

The sum function applied in the summation circuit 416 in the variable node 402 can be expressed in the LLR domain as set forth in Equation 5:

$$LLR_{out} = LLR_{C1} + LLR_{C2} + LLR_{obs} \quad \text{Equation 5}$$

where $LLR_{out}$ is the LLR of output message 432, $LLR_{C1}$ is the LLR provided in an extrinsic message from a first neighboring check node, $LLR_{C2}$ is the LLR provided in an extrinsic message from a second neighboring check node, and $LLR_{obs}$ is the LLR of the observed value in the variable node 402, based on the value read from a data channel and provided to the variable node 402. A probability ratio will be included in Equation 4 for each extrinsic message from neighboring check nodes.

The min-sum operation performed in min-sum circuit 448 in check node 404 can be expressed as set forth in Equation 6:

$$LLR_{out} = \text{sgn}(LLR_{V1} LLR_{V2}) \cdot \min(LLR_{V1}, LLR_{V2}) \quad \text{Equation 6}$$

where $LLR_{out}$ is the LLR of output message 460, $LLR_{V1}$ is the LLR provided in an extrinsic message from a first neighboring variable node, $LLR_{V2}$ is the LLR provided in an extrinsic message from a second neighboring variable node, sgn (ab) is the sign of a times b, and min(a,b) is the minimum of a and b. When applying Equation 6, an LLR value will be included from each extrinsic message from neighboring variable nodes.

Figure 5A:
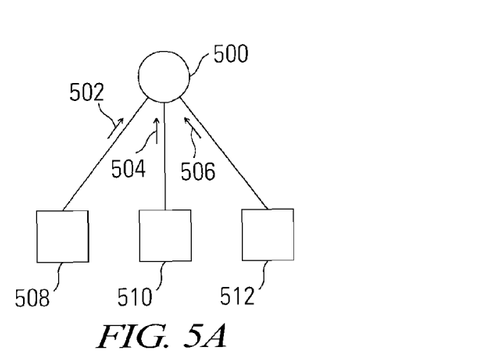
FIG. 5A depicts a diagram of a variable node processing incoming messages from neighboring check nodes in accordance with various embodiments of the present invention.

Turning to FIG. 5A, an example of the processing in a variable node 500 of incoming messages from neighboring check nodes 508, 510, 512 is depicted in accordance with various embodiments of the present invention. The processing of incoming messages illustrated in FIG. 5A is performed in probability trackers (e.g., 408) in a variable node (e.g., 402) according to Equation 2. The probability value (e.g., 410) is tracked separately for the incoming stochastic bit stream (e.g., 406) from each neighboring check node, one probability tracker (e.g., 408) per incoming stochastic bit stream (e.g., 406). A variable node 500 receives messages 502, 504, 506 from three neighboring check nodes 508, 510, 512, respectively. In this example, the initial observed value for variable node 500 is set to 0.2, obtained through the read channel from a physical storage medium 210 or transmission channel 266. The probability trackers associated with check nodes 508, 510, 512 are each initialized with this channel value of 0.2 as the initial probability value $m_{c \to v}(i-1)$. If message 502 ($b_{c \to v}$) from check node 508 is 0, and the sensitivity factor $k_v$ is 0.125 for each probability tracker in the variable node 500, the new probability value $m_{c \to v}(i)$ for check node 508 is equal to $m_{c \to v}(i) = k_v \cdot (b_{c \to v}) + (1 - k_v) \cdot m_{c \to v}(i-1)$ or $(0.125)(0) + (1 - 0.125)(0.2) = 0.175$. Thus, the probability for check node 508 in variable node 500 moves from an initial value of 0.2 down to 0.175 upon receiving a 0 as a message from check node 508. If message 504 ($b_{c \to v}$) from check node 510 is 1, the new probability value $m_{c \to v}(i)$ for check node 510 is equal to $(0.125)(1) + (1 - 0.125)(0.2) = 0.3$. Thus, the probability for check node 510 in variable node 500 moves from an initial value of 0.2 up to 0.3 upon receiving a 1 as a message from check node 510. The probability value for check node 512 in variable node 500, upon receiving a 1 as a message from check node 512, drops from 0.2 to 0.175, as with check node 508. Again, the messages 502, 504, 506 from check nodes 508, 510, 512 represent the probability that the variable node 500 has a certain value, in this case 0.2, given all the prior round messages passed to those 508, 510, 512 from neighboring variable nodes other than the destination variable node 500.

Figure 5B:
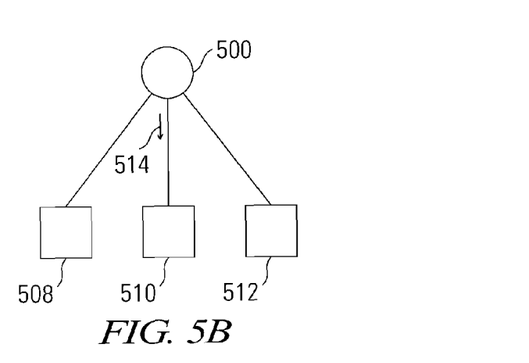
FIG. 5B depicts a diagram of a variable node generating an outgoing message to a neighboring check node in accordance with various embodiments of the present invention.

Turning to FIG. 5B, an example of the generating of an outgoing message 514 to a neighboring check node 510 in a variable node 500 is depicted in accordance with various embodiments of the present invention. The generating of an outgoing message 514 illustrated in FIG. 5B is performed in a summation circuit (e.g., 416) in a variable node (e.g., 402) according to Equation 5. The calculation for outgoing message 514 is based on extrinsic messages 502 and 506, excluding message 504 to avoid positive feedback. The probabilities in messages 502 and 506 (each 0.175 as explained with respect to FIG. 5A) and the observed value in variable node 500 (initialized at 0.2 as explained with respect to FIG. 5A) are first converted to the LLR domain according to Equation 1. The LLR values are added together as in Equation 5. The resulting LLR value (e.g., 432) is compared with the LLR values of random numbers (e.g., 430) in a comparator (e.g., 434), which converts the LLR values to a binary stochastic bit stream representing a probability.

Figure 6A:
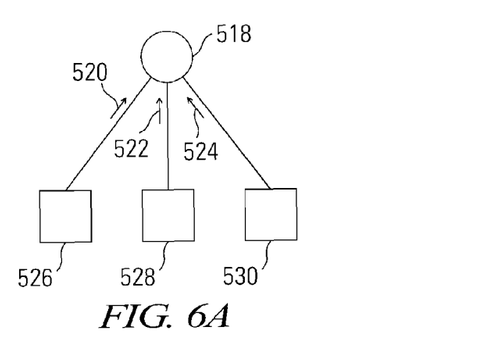
FIG. 6A depicts a diagram of a check node processing incoming messages from neighboring variable nodes in accordance with various embodiments of the present invention.

Turning to FIG. 6A, an example of the processing in a check node 518 of incoming messages 520, 522, 524 from neighboring variable nodes 526, 528, 530 is depicted in accordance with various embodiments of the present invention. The processing of incoming messages 520, 522, 524 illustrated in FIG. 6A is performed in probability trackers (e.g., 440) in a check node (e.g., 404) according to Equation 3. The probability value (e.g., 442) is tracked separately for the incoming stochastic bit stream (e.g., 436) from each neighboring variable node (e.g., 402), one probability tracker (e.g., 440) per incoming stochastic bit stream (e.g., 436). In some embodiments, the value for check node 518 is initialized to the channel value obtained through the read channel from a physical storage medium 210 or transmission channel 266, as for the variable node 500. However, in the example of FIG. 6A, the decoding process is ongoing and the initial probability values $m_{v \to c}(i-1)$ for the current round are 0.75 for variable node 526, 0.6 for variable node 528 and 0.25 for variable node 530. If message 520 ($b_{v \to c}$) from check node 526 is 0, and the sensitivity factor $k_c$ is 0.125 for each probability tracker in the check node 518, the new probability value $m_{v \to c}(i)$ for check node 518 is equal to $m_{v \to c}(i) = k_c \cdot (b_{v \to c}) + (1-k_c) \cdot m_{v \to c}(i-1)$ or $(0.125)(0)+(1-0.125)(0.75) \approx 0.65$. Thus, the probability for variable node 526 in check node 518 moves from an initial value of 0.75 down to about 0.65 upon receiving a 0 as a message from variable node 526. If message 522 ($b_{v \to c}$) from variable node 528 is 1, the new probability value $m_{v \to c}(i)$ for variable node 528 is equal to $(0.125)(1)+(1-0.125)(0.6)=0.65$. Thus, the probability for variable node 528 in check node 518 moves from a value of 0.6 up to 0.65 upon receiving a 1 as a message ($b_{v \to c}$) from variable node 528. The probability value for variable node 530 in check node 518, upon receiving a 0 as a message ($b_{v \to c}$) 524 from variable node 530, drops from 0.25 to 0.21. Again, the messages from variable nodes 526, 528, 530 represent the probability that the variable nodes 526, 528, 530 have certain values based on the observed value of the bit and on all the messages from neighboring check nodes in a prior round other than the check node 518 for which the message is prepared.

Figure 6B:
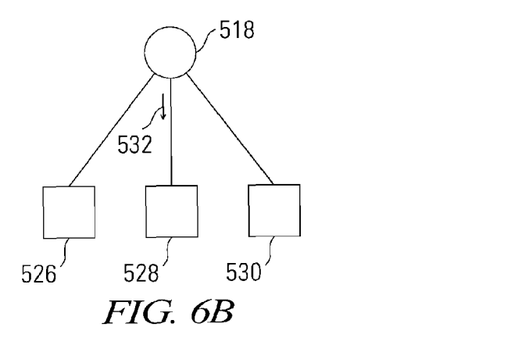
FIG. 6B depicts a diagram of a check node generating an outgoing message to a neighboring variable node in accordance with various embodiments of the present invention.

Turning to FIG. 6B, an example of the generating of an outgoing message 532 to a neighboring variable node 528 in a check node 518 is depicted in accordance with various embodiments of the present invention. The generating of an outgoing message 532 illustrated in FIG. 6B is performed in a min-sum circuit (e.g., 448) in a check node (e.g., 404) according to Equation 6. Again, the check nodes in a binary LDPC stochastic stream decoder are not limited to the example min-sum operation and may implement any suitable real-value decoding algorithm. In this example, the outgoing message 532 is generated in the check node 518 based on previous extrinsic messages 520 and 524 from variable nodes 526 and 530, omitting message 522 from variable node 528 which will be the recipient of the outgoing message 532. The outgoing message 532 is calculated in this example by converting the probabilities (0.65 and 0.21) represented in messages 520 and 524, respectively, to LLR values. The sign of the resulting LLR values is then multiplied by the minimum of the two LLR values to give the LLR value of the outgoing message 532. The LLR value of the outgoing message 532 is converted to a binary stochastic bit stream representing a probability by comparing the LLR value of the outgoing message 532 with the LLR values of random numbers.

Figure 7:
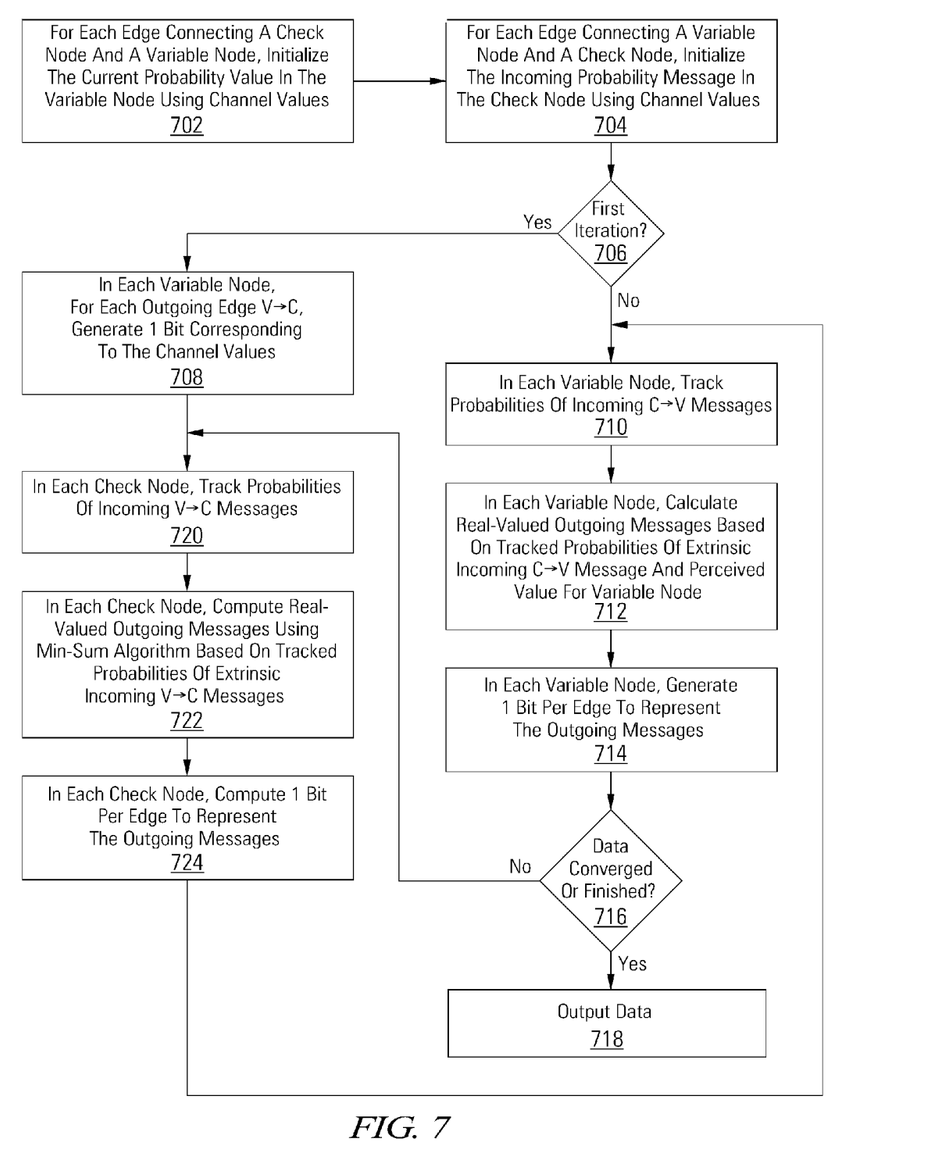
FIG. 7 is a flow diagram showing a method for stochastic stream decoding of binary LDPC codes in accordance with some embodiments of the present invention.

Turning to FIG. 7, a flow diagram depicts a method for stochastic stream decoding of binary LDPC codes in accordance with some embodiments of the present invention. The method of FIG. 7, or variations thereof, may be performed in data decoding circuits such as those illustrated in FIGS. 2A, 2B, 3 and 4. Following flow diagram 700, the current probability value for each edge connecting a check node and a variable node is initialized in the variable node using channel values. (Block 702) The incoming probability message for each edge connecting a variable node and a check node is initialized in the check node using channel values. (Block 704) It is determined whether it is the first local iteration. (Block 706) If it is the first local iteration, one bit is generated in each variable node corresponding to the channel values for each outgoing edge $v \to c$. (Block 708) If it is not the first local iteration, processing is performed in each variable node to track probabilities of incoming $c \to v$ messages (Block 710), to calculate real-valued outgoing messages based on tracked probabilities of extrinsic incoming $c \to v$ message and the perceived value for variable node (Block 712), and to generate one bit per edge to represent the outgoing messages (Block 714). The perceived values are determined in variable nodes each time messages are received from neighboring check nodes. Upon receipt of the check node messages, the LLR values are calculated at the variable nodes. Depending on the sign of the result, the perceived value or intermediate decoded value is calculated as 1 or 0 appropriately. It is then determined if the data in the variable nodes has converged or the process is otherwise finished, such as if all memory is filled or if the process has run too long. (Block 716) If the data has converged or the process is finished, the data is output from the LDPC stochastic stream decoder. (Block 718) If not, processing is performed in each check node to track probabilities of incoming $v \to c$ messages (Block 720), to compute real-valued outgoing messages using, for example, but not limited to, a min-sum algorithm based on tracked probabilities of extrinsic incoming $v \to c$ messages (Block 722), and to compute one bit per edge to represent the outgoing messages (Block 724). The single bit per edge messages may be computed in variable nodes and check nodes as described above, using a comparator and random number generator or any other suitable device to produce a stochastic bit stream.

In conclusion, the present invention provides novel systems, devices, methods and arrangements for stochastic stream decoding of binary LDPC codes. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A data decoder circuit, the data decoder circuit comprising:
    a plurality of variable nodes;
    a plurality of check nodes;
    a plurality of serial connections between the plurality of variable nodes and the plurality of check nodes;
    wherein the plurality of variable nodes and the plurality of check nodes are operable to send variable node to check node messages and check node to variable node messages as stochastic bit streams, wherein the plurality of variable nodes and the plurality of check nodes are operable to perform floating point operations based on the stochastic bit streams, and wherein the variable node to check node messages and the check node to variable node messages are passed iteratively between the plurality of variable nodes and the plurality of check nodes.

2. The data decoder circuit of claim 1, wherein the data decoder circuit comprises a low density parity check decoder.

3. The data decoder circuit of claim 1, wherein the data decoder circuit is implemented as an integrated circuit.

4. The data decoder circuit of claim 1, wherein the data decoder circuit is incorporated in a storage device.

5. The data decoder circuit of claim 1, wherein the data decoder circuit is incorporated in a data transmission device.

6. The data decoder circuit of claim 1, wherein the stochastic bit streams represent real probability values as a mean of successive random binary values.

7. The data decoder of claim 1, wherein the plurality of variable nodes and the plurality of check nodes are operable to convert the variable node to check node messages and the check node to variable node messages from stochastic bit streams to probability values.

8. The data decoder of claim 7, wherein the plurality of variable nodes and the plurality of check nodes each comprise a tracking filter operable to calculate an exponential moving average of variable node to check node messages and check node to variable node messages.

9. The data decoder circuit of claim 1, wherein the plurality of variable nodes are operable to implement a belief propagation decoding algorithm, and wherein the plurality of check nodes are operable to implement a min-sum decoding algorithm.

10. A method for decoding binary low density parity check codes, the method comprising:
 iteratively passing stochastic bit streams between a plurality of variable nodes and a plurality of check nodes in a low density parity check decoder;
 converting the stochastic bit streams to probability values in the plurality of variable nodes and in the plurality of check nodes; and
 performing floating point calculations in the plurality of variable nodes and in the plurality of check nodes based at least in part on the probability values.

11. The method of claim 10, wherein the floating point calculations comprise a min-sum operation in the plurality of check nodes.

12. The method of claim 11, wherein the min-sum operation is performed in a log likelihood ratio domain.

13. The method of claim 10, wherein converting the stochastic bit streams to probability values comprises filtering the stochastic bit streams with an exponential moving average.

14. The method of claim 10, further comprising converting the probability values to log likelihood ratios in the plurality of variable nodes and in the plurality of check nodes.

15. The method of claim 10, further comprising converting log likelihood ratios in the plurality of variable nodes and in the plurality of check nodes to the stochastic bit streams.

16. The method of claim 15, wherein converting the log likelihood ratios comprises generating random numbers in the plurality of variable nodes and in the plurality of check nodes, converting the random numbers to random log likelihood ratios, and comparing the log likelihood ratios to the random log likelihood ratios to yield the stochastic bit streams.

17. The method of claim 10, wherein the stochastic bit streams comprise serial bit streams.

18. A storage system, comprising:
 a storage medium;
 a read/write head assembly operable to sense a data set on the storage medium and to provide an analog signal corresponding to the data set;
 an analog to digital converter operable to sample the analog signal to yield a digital data stream; and
 a low density parity check decoder operable to decode the digital data stream, wherein the low density parity check decoder includes a plurality of variable nodes and a plurality of check nodes operable to transmit stochastic bit streams between each other, wherein the plurality of variable nodes and the plurality of check nodes are operable to perform floating point operations based on the stochastic bit streams.

19. The storage system of claim 18, wherein the low density parity check decoder is operable to implement a min-sum based decoding algorithm.

20. The storage system of claim 18, wherein the plurality of variable nodes and the plurality of check nodes are operable to convert the stochastic bit streams to probability values.

* * * * *